United States Patent
Saleem et al.

(10) Patent No.: US 11,669,111 B2
(45) Date of Patent: Jun. 6, 2023

(54) VALVE ASSEMBLY AND SYSTEM USED TO CONTROL FLOW RATE OF A FLUID

(71) Applicant: Illinois Tool Works Inc., Glenview, IL (US)

(72) Inventors: Mohamed Saleem, Freemont, CA (US); Arun Nagarajan, Freemont, CA (US); Daniel Mudd, Freemont, CA (US); Hossein Ghapanchizadeh, Freemont, CA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 17/010,496

(22) Filed: Sep. 2, 2020

(65) Prior Publication Data

US 2021/0080981 A1    Mar. 18, 2021

Related U.S. Application Data

(60) Provisional application No. 62/900,322, filed on Sep. 13, 2019.

(51) Int. Cl.
*G05D 7/01* (2006.01)
*G01F 1/36* (2006.01)
(Continued)

(52) U.S. Cl.
CPC ............ *G05D 7/0113* (2013.01); *F16K 1/32* (2013.01); *F16K 1/36* (2013.01); *F16K 1/42* (2013.01);
(Continued)

(58) Field of Classification Search
CPC ...... G05D 7/0113; G05D 7/0635; F16K 1/32; F16K 1/36; F16K 1/42; F16K 1/00;
(Continued)

(56) References Cited

U.S. PATENT DOCUMENTS

| | | | |
|---|---|---|---|
| 2002/0174899 A1* | 11/2002 | Adams | ................. G05D 7/0635 137/487.5 |
| 2003/0135335 A1 | 7/2003 | Grumstrup et al. | |

(Continued)

OTHER PUBLICATIONS

Extended European Search Report dated Jan. 14, 2021, issued in related co-pending EP 20195520.0.

*Primary Examiner* — Patrick C Williams
(74) *Attorney, Agent, or Firm* — McGuireWoods LLP

(57) ABSTRACT

A valve assembly for controlling fluid flow rate comprising a valve block, a valve, a sensor chip package, and a controller interface. The valve block having an upstream reservoir, a downstream reservoir, and a valve seat for communicating fluid from an upstream location to a downstream location. The valve having a moveable member. The sensor chip package having at least one sensor coupled with the valve. The controller interface is communicable coupled to a control unit, the valve, and the sensor chip package. The controller interface sends at least one parametric value provided by the sensor chip package to the control unit. The controller interface receives a control signal used to adjust valve stroke of the valve. The control signal of the valve is determined based on the at least one measured parametric value and at least one other parametric value provided by a fluid processing system.

3 Claims, 5 Drawing Sheets

(51) Int. Cl.
*G01F 15/00* (2006.01)
*F16K 1/32* (2006.01)
*F16K 1/36* (2006.01)
*F16K 1/42* (2006.01)
*F16K 27/02* (2006.01)
*F16K 31/06* (2006.01)
*F16K 37/00* (2006.01)
*F16K 17/04* (2006.01)
*H01L 21/67* (2006.01)
*G05D 7/06* (2006.01)
*F16K 1/00* (2006.01)

(52) U.S. Cl.
CPC .............. *F16K 17/04* (2013.01); *F16K 27/02* (2013.01); *F16K 27/029* (2013.01); *F16K 31/0655* (2013.01); *F16K 31/0675* (2013.01); *F16K 37/0091* (2013.01); *G01F 1/36* (2013.01); *G01F 15/005* (2013.01); *H01L 21/67017* (2013.01); *H01L 21/67242* (2013.01); *F16K 1/00* (2013.01); *F16K 37/005* (2013.01); *G05D 7/0635* (2013.01)

(58) Field of Classification Search
CPC ........ F16K 17/04; F16K 27/02; F16K 27/029; F16K 31/0655; F16K 31/0675; F16K 37/0091; F16K 37/005; G01F 1/36; G01F 15/005; H01L 21/67017; H01L 21/67242
See application file for complete search history.

(56) References Cited

U.S. PATENT DOCUMENTS

| | | | |
|---|---|---|---|
| 2008/0092632 A1* | 4/2008 | Hoffmann | F16K 37/0091 73/40.5 A |
| 2012/0132291 A1 | 5/2012 | Monkowski et al. | |
| 2016/0077531 A1* | 3/2016 | Kucera | F16K 37/0091 137/2 |
| 2017/0060143 A1 | 3/2017 | Ding et al. | |
| 2018/0106698 A1* | 4/2018 | Karg | F23K 5/007 |
| 2018/0173249 A1* | 6/2018 | Hayashi | F16K 37/005 |
| 2019/0294184 A1* | 9/2019 | Al Khunaizi | G01M 3/2815 |

* cited by examiner

VALVE ASSEMBLY AND SYSTEM USED TO CONTROL FLOW RATE OF A FLUID

CROSS-REFERENCE TO RELATED APPLICATIONS

This application claims the benefit of U.S. Provisional Application No. 62/900,322 filed on Sep. 13, 2019, the entire disclosure of which is expressly incorporated herein by reference.

BACKGROUND

Equipment used in the manufacture of semiconductor wafers are required to operate with a high degree of precision in order to maintain desired production yields. In a process to create integrated circuits, semiconductor wafers are treated within a process chamber using certain chemicals. Mass Flow Controllers (MFCs) are used in an arranged configuration to deliver these chemicals to the process chamber in a timely consistent manner and with a consistent flow rate. This can be significantly challenging as the MFCs are required to hold very tight accuracies, operate at multiple set points and constantly shutdown and restart during the wafer manufacturing process. In order to manage such accuracies, current state of the art MFC's are equipped with processor based control units, a multitude of sensors, and an advanced diagnostics system. However, these high-end MFC's are quite expensive and may go well beyond a manufacturer's needs.

BRIEF DESCRIPTION OF THE DRAWINGS

For a more complete understanding of the features and advantages of the present disclosure, reference is now made to the detailed description along with the accompanying figures in which corresponding numerals in the different figures refer to corresponding parts and in which.

DETAILED DESCRIPTION

Figure 1A:
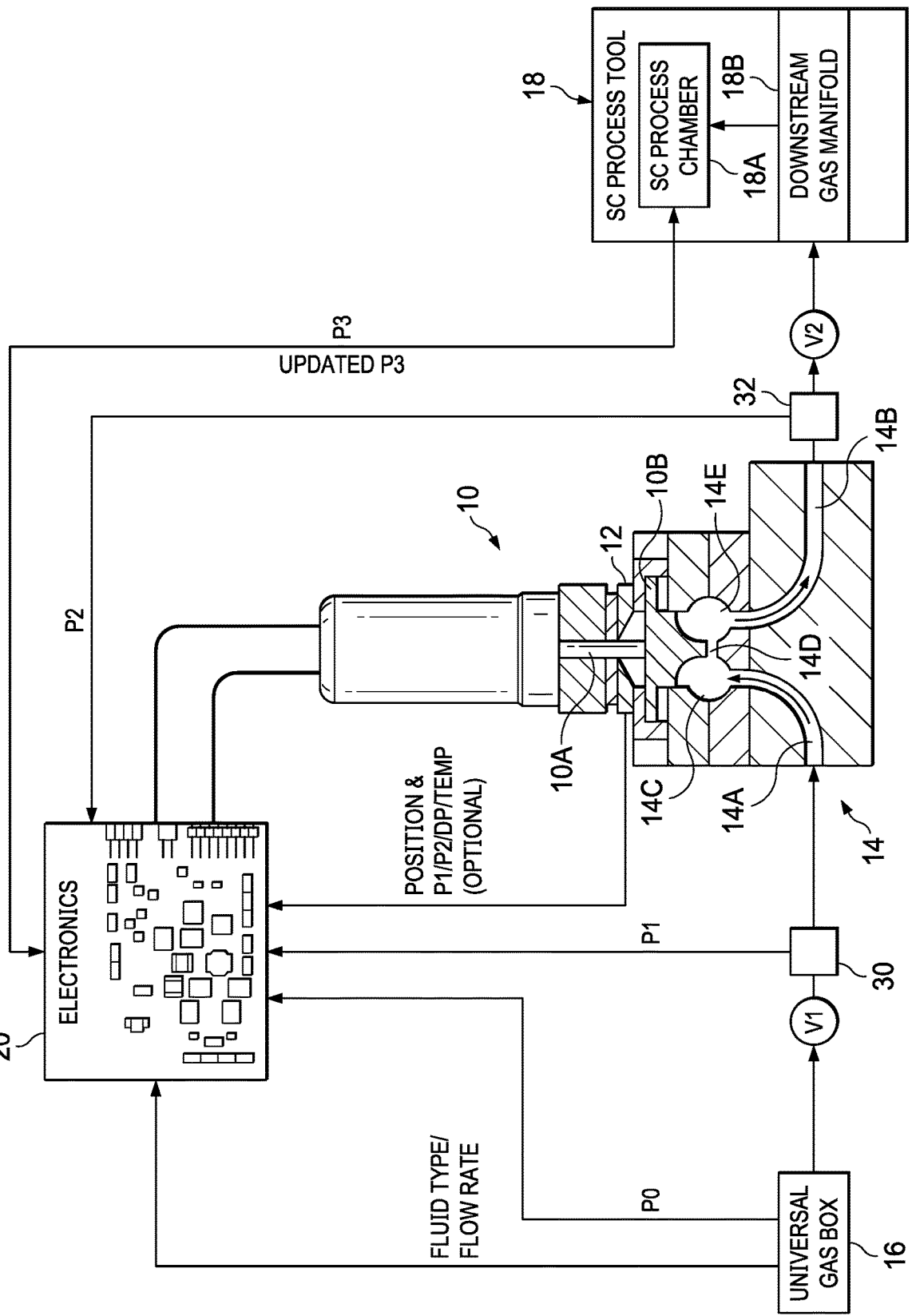
FIGS. 1A-1C are illustrations of a valve assembly and a fluid processing system for managing appropriate delivery of fluid for manufacturing operations, such as semiconductor processing manufacturing operations, in accordance with certain example embodiments.

While the making and using of various embodiments of the present disclosure are discussed in detail below, it should be appreciated that the present disclosure provides many applicable inventive concepts, which can be embodied in a wide variety of specific contexts. The specific embodiments discussed herein are merely illustrative and do not delimit the scope of the present disclosure. In the interest of clarity, not all features of an actual implementation may be described in the present disclosure. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would be a routine undertaking for those of ordinary skill in the art having the benefit of this disclosure.

As previously stated, current state of the art and commercially available MFC's are quite expensive and may go well beyond a manufacturer's needs. Even if a particular MFC met a particular manufacturer's needs, the manufacturer's manufacturing facility, in some cases, may already include its own processor based control units, sensors, and advanced diagnostics systems. As an example, process chambers used in an etching process to etch circuits on a semiconductor wafer use separate control units, sensors, and diagnostics systems. In these particular cases, current state of the art and commercially available MFC's provides hardware and functional services that are redundant and, therefore, adds to manufacturing costs. As such, there is a need for a valve assembly that can integrate with a manufacturer's manufacturing operations and use parametric variables provided from the operations to maintain a mass flow rate of a fluid at very tight accuracies while operating at multiple set points and constantly shutting down and restarting during a manufacturing process.

Presented herein is a valve assembly for controlling fluid flow rate. The valve assembly comprises a valve block having an upstream reservoir, a downstream reservoir and a valve seat for communicating fluid from an upstream location to a downstream location. The valve assembly further comprises a stand-alone valve having a moveable member, a sensor chip package having at least one sensor coupled with the stand-alone valve, and a controller interface. The controller interface sends at least one measured parametric value provided by the at least one sensor and receives a control signal that is used to adjust valve stroke of the stand-alone valve. The control signal is determined based on the at least one measured parametric value.

In some embodiments, the control signal of the stand-alone valve is determined based on the at least one measured parametric value and at least one other parametric value. In some embodiments, the valve assembly can also comprise a control unit having an interface for communicating with the controller interface of the stand-alone valve. The control unit can also include another interface for receiving at least one other parametric value. The at least one other parametric value indicates a pressure for at least one selected from a group comprising at least one upstream pressure sensor positioned at an upstream location from the stand-alone valve and at least one downstream pressure sensor positioned at a downstream location of the stand-alone valve. The control unit can also generate the control signal to cause an adjustment to valve stroke based on the at least one parametric value and the at least one other parametric value.

In some additional embodiments, the sensor chip package comprises a position sensor. The sensor chip package generates the at least one parametric value indicating at least one selected from a group comprising a position of the moveable member and obstruction of a non-moveable member. The sensor chip package can also comprise at least one upstream pressure sensor positioned in an upstream reservoir or upstream channel of the valve block. The sensor chip package can also comprise at least one downstream pressure sensor positioned in a downstream reservoir or downstream channel of the valve block. The sensor chip package can also comprise a differential pressure sensor positioned in the upstream reservoir and the downstream reservoir. The sensor chip package can also comprise a temperature sensor positioned in at least one selected from a group comprising the upstream reservoir, the upstream channel, the downstream reservoir, the downstream channel, and a valve seat.

In some embodiments, the sensor chip package can generate a parametric value indicating position of the moveable member. The sensor package can also generate a parametric value indicating obstruction of a non-moveable member. The sensor chip package can also generate a parametric value or values indicating pressure of at least one selected from a group comprising the upstream pressure sensor, the downstream pressure sensor, and the differential pressure sensor positioned in the valve block. The sensor chip package can also generate a parametric value indicating heat In some other embodiments, the sensor chip package can generate a parametric value indicating position of the moveable member. The sensor chip package can also generate a parametric value indicating obstruction of a non-moveable member. The sensor chip package can also generate a parametric value indicating pressure of at least one selected from a group comprising the upstream pressure sensor, the downstream pressure sensor, and the differential pressure sensor. The sensor chip package can also generate a parametric value indicating temperature of at least one selected from a group comprising the upstream reservoir, upstream channel, the valve seat, the downstream reservoir, and the downstream channel.

Also presented herein is a fluid processing system for use in a manufacturing facility. The fluid processing system comprises a valve block, a stand-alone valve, an upstream fluid source fluidly coupled to the stand-alone valve, a downstream process tool fluidly coupled to the stand-alone valve, and a control unit. The valve block includes an upstream reservoir, a downstream reservoir and a valve seat for communicating fluid from an upstream location to a downstream location. The stand-alone valve having a moveable member and a sensor chip package having at least one sensor coupled with the valve. The control unit includes an interface that is communicable coupled to the stand-alone valve and the sensor chip package. The control unit generates a control signal that is used to control stroke of the stand-alone valve based on at least one parametric value from the sensor chip package.

In some embodiments, the interface of the control unit is communicable coupled with at least one selected from a group comprising at least one upstream pressure sensor positioned at an upstream location and at least one downstream pressure sensor positioned at a downstream location. In these embodiments, the interface generates the control signal used to control stroke of the stand-alone valve based on the at least one parametric value from the sensor chip package and at least one other parametric value. The other parametric value indicating pressure from the group comprising the at least one upstream pressure sensor positioned at an upstream location from the valve block and the at least one downstream pressure sensor positioned at a downstream location from the valve block.

The sensor chip package comprises a position sensor. The sensor chip package generates a parametric value indicating at least one selected from a group comprising a position of the moveable member and obstruction of a non-moveable member. In some embodiments, the sensor chip package can also comprise an upstream pressure sensor positioned in an upstream reservoir of the valve block. In some embodiments, the sensor chip package can also comprise a downstream pressure sensor positioned in a downstream reservoir of the valve block. In some embodiments, the sensor chip package can also comprise a differential pressure sensor positioned in the upstream reservoir and the downstream reservoir. In some embodiments, the sensor chip package includes a temperature sensor positioned in at least one selected from a group comprising the upstream reservoir, the upstream channel, the downstream reservoir, the downstream channel, and a valve seat.

The sensor chip package generates a parametric value indicating position of at least one selected from a group comprising a position of the moveable member and obstruction of a non-moveable member. In some embodiments, the sensor chip package generates a parametric value or values indicating pressure of at least one selected from a group comprising the upstream pressure sensor, the downstream pressure sensor, and the differential pressure sensor. In some embodiments, the sensor chip package generates a parametric value indicating temperature of at least one selected from a group comprising the upstream reservoir, the valve seat, and the downstream reservoir. In some embodiments, the upstream fluid source comprises an upstream pressure sensor. In some embodiments, the downstream process tool comprises a downstream pressure sensor.

Upstream or upstream side, as used herein, refers to a location or side closest to a fluid source, e.g. after an upstream valve or before a downstream valve in an MFC. MFC High Pressure (HP) or HP side, as used herein, refers to the upstream or upstream side. Downstream or downstream side, as used herein, refers to the location or side farthest from a fluid source. Position pre-determined value or values, as used herein, refer to a-priori variables that include valve seat position values based on variables that include valve seat position values and fluid flow rates. Valve seat opening, as used herein, refers to the valves instant position in either the valve's closed state or open state or any position in between the closed and open state. Volume, as used herein, are reservoirs of known volume used as a point in a flow line to take pressure measurements of fluid flowing through a flow line. The term parametric value, as used herein, refers to a variable having a parameter and value. Control signal, as used herein, refers to an encoded signal which can also be a variable.

Figure 1B:
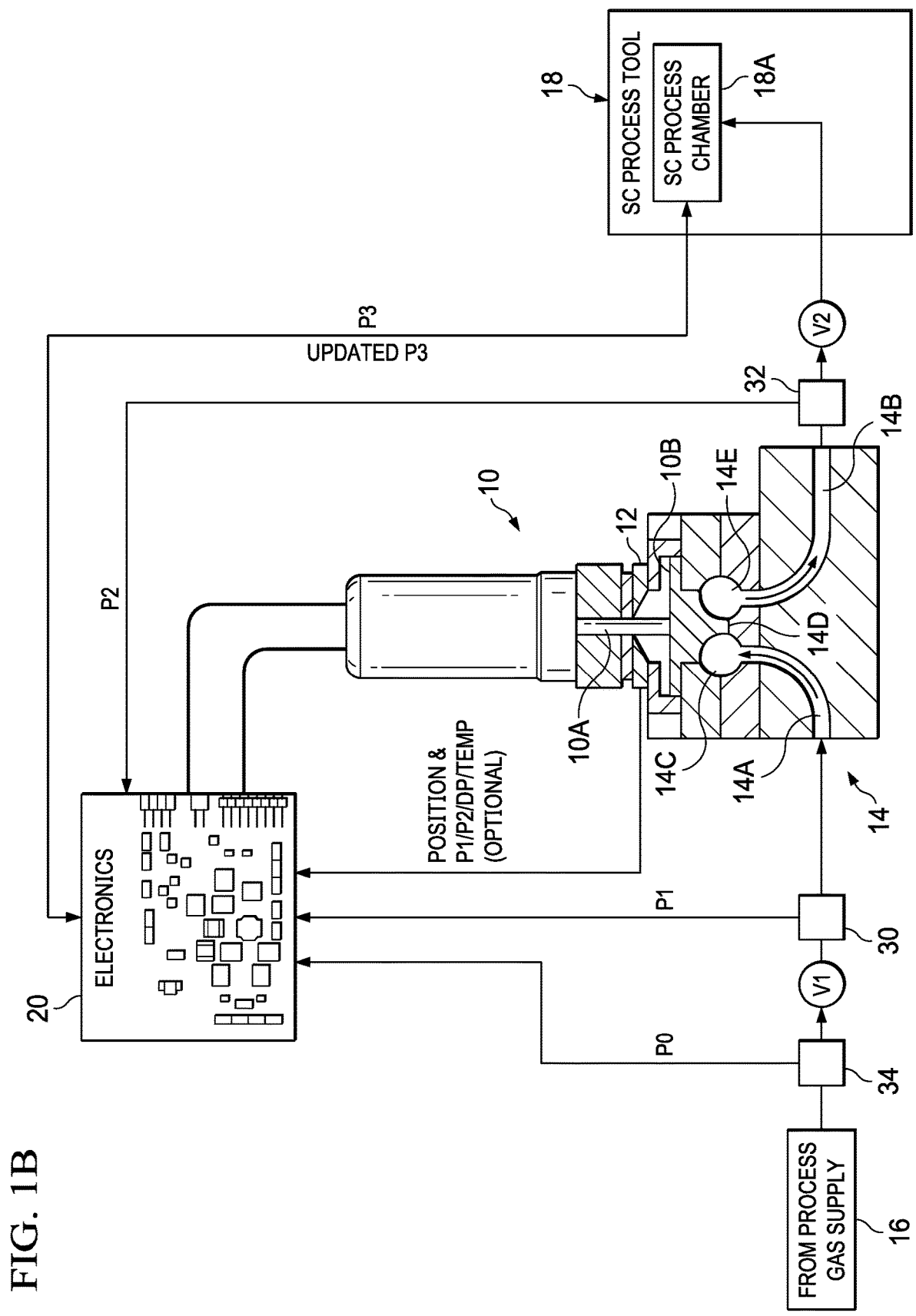
Figure 1C:
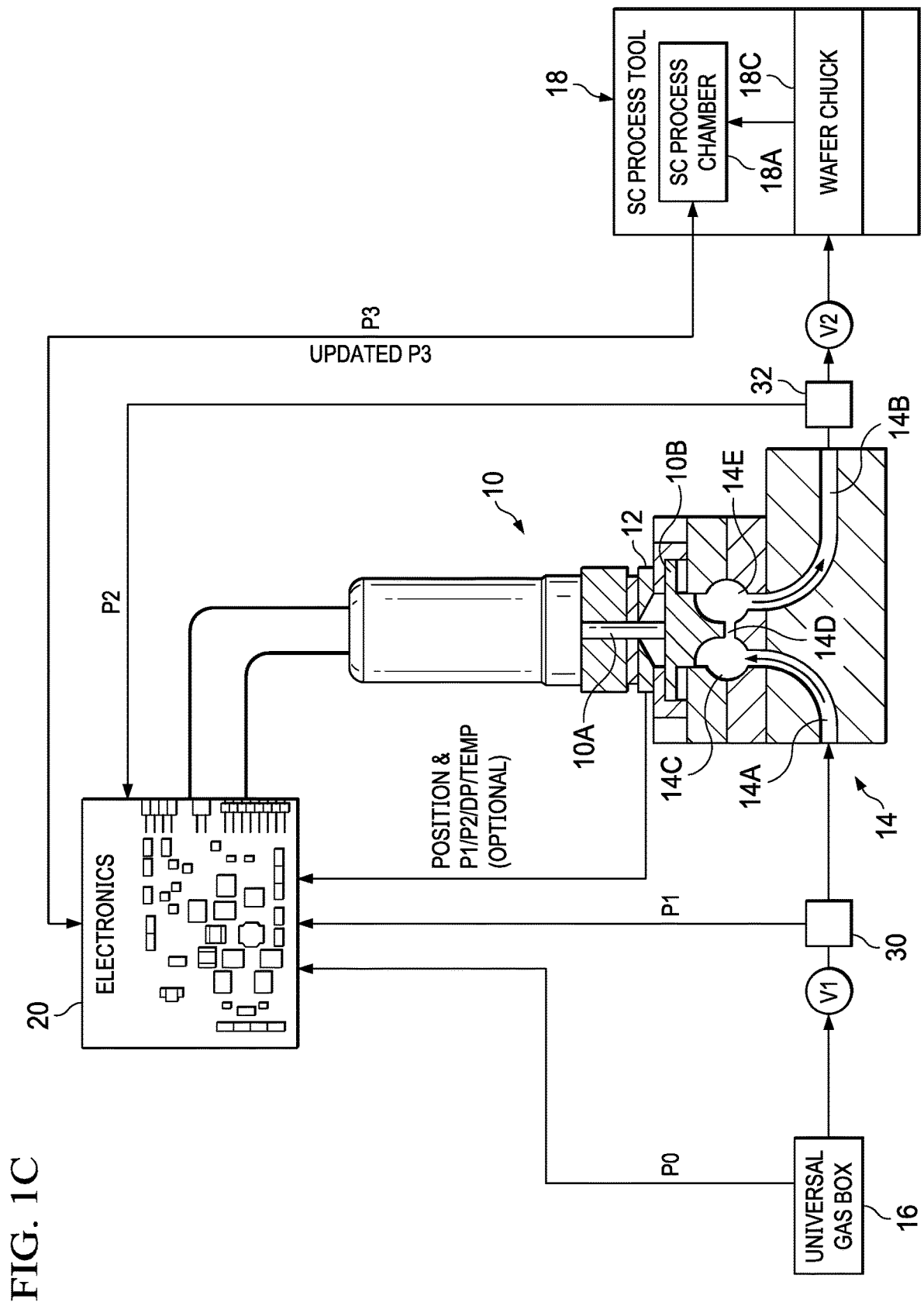

Referring now to FIGS. 1A-1C, illustrated is a valve assembly and a fluid processing system for managing appropriate delivery of fluid for manufacturing operations, such as semiconductor processing manufacturing operations, in accordance with certain example embodiments. In essence, the fluid processing system is a third party system. The valve assembly comprises a valve 10 (piezo or solenoid), a sensor chip package 12, and a valve block 14. The valve assembly can also include a control unit 20. However, the control unit 20 can be a part of the fluid processing system for which the valve assembly communicable couples with. In addition, the control unit 20 can be a processing unit provided with the valve assembly and a processing unit provided by the fluid processing system integrated to perform a particular task. The fluid processing system comprises a fluid source 16 and a process tool 18. The control unit 20, in combination with feedback from the valve assembly and the fluid processing system, controls the valve assembly in order to maintain a desired fluid flow rate of fluid communicated between the fluid source 16 in an upstream location and the process tool 18 in the downstream location based on read parametric values. In addition, any changes to an actual flow rate based on the desired flow rate are communicated to the process tool 18 in the form of at least one parametric value, such as an absolute pressure value.

The valve 10 is coupled to the valve block 14. The valve 10 comprises a moveable member, such as a valve stem 10A and disk 10B. The valve block 14 comprises a channel that includes an upstream entrance channel 14A, a downstream exit channel 14B, an upstream reservoir 14C, valve seat 14D, and downstream reservoir 14E. Any flow path between the fluid source 16 and process tool 18 has a known volume and can be used along with the parametric values described herein by the control unit 20 to control position of the valve stem 10A or disk 10B. The valve stem 10A and disk 10B are responsive to a command from the control unit 20A. The stroke of the valve 10 is represented by the valve stem 10A and disk 10B when the valve stem 10A and disk 10B is fully open, fully closed, or between fully open and fully closed. The valve 10 is fully closed when the disk 10B is flush with the valve seat 14C. In response to an open operation, fluid is communicated from the upstream channel 14A into the upstream reservoir 14C, through the valve seat 14D, through the downstream reservoir 14E, and through the downstream exit channel 14B at a flow rate defined by the degree to which the valve seat 14C is opened. Obviously, the degree to which the valve seat 14C is opened is based on several parametric values, such as a set point value, fluid type, position of the moveable member, current flow rate, temperature, and pressure.

In an embodiment, the valve assembly includes only the single valve 10 and sensor chip package 12 with the sensor chip package 12 having a position sensor. In another embodiment, the sensor chip package 12 includes a position sensor and at least one selected from a group comprising an absolute pressure sensor and a differential pressure sensor. Stated differently, the sensor chip package 12 can include a position sensor and at least one absolute pressure sensor, or at least one differential pressure sensor, or a combination of absolute pressure sensor, or sensors, and differential pressure sensor, or sensors. In some embodiments, the sensor ship package 12 can include a Differential Pressure (DP) sensor or a temperature sensor, or both. The sensors can be positioned in any flow path of the valve block 14, such as the entrance channel 14A, exit channel 14B, upstream reservoir 14C, valve seat 14D, and downstream reservoir 14E.

In FIG. 1A, the manufacturer's fluid processing system includes a universal gas box as the fluid source 16 and the process tool 18 includes a process chamber 18A and a gas manifold 18B. In FIG. 1B, the manufacturer's fluid processing system includes a fluid source 16 that is from an upstream process and the process tool 18 includes the process chamber 18A. In this embodiment, process gas supply is provided to the process chamber 18A by positioning the valve between universal gas box and process chamber and closer to the chamber lid. In FIG. 1C, the fluid source 16 is helium and the process tool 18 includes a wafer chuck 18C. In the embodiments of FIGS. 1A, 1B, and 1C, a pressure sensor 30 is positioned at an upstream location of the valve assembly in order to measure pressure and generate parametric value P1 at Volume 1 (V1). Further to this embodiment, a pressure sensor 32 is positioned at a downstream location of the valve assembly in order to measure pressure and generate parametric value P2 at Volume 2 (V2). However, depending on the configuration of the valve assembly, pressure sensors 30 and 32 may not be needed. Further to the embodiments of FIGS. 1A and 1C, sensors integrated into the manufacturer's fluid source 16 and process tool 18 are used to measure pressures and generate parametric values P0 and P3, respectively. In the embodiment of FIG. 1B, another sensor 34 is positioned between the fluid source 16 and V1 to measure pressure and generate parametric value P0. The pressure sensors 30 and 32 can be a gage, differential, or absolute pressure sensors, or any combination thereof.

Further to each embodiment, the sensor chip package 12 communicates the position of the valve stem 10A and/or the disk 10B, or other moveable flow limiting mechanisms, such as a ball on seat, to the control unit 20 for reading and processing. A-priori information describing stroke of the valve stem 10A and/or the disk 10B, e.g. position 0 is valve closed, position 10 is full open, and various variables describing positions there between, can be stored in memory or a hard disk associated with the control unit 20 and correlated with stored flow rate values. In some of these embodiments, the sensor chip package 12, in addition to the position sensor, includes an upstream absolute pressure sensor, e.g. positioned in the upstream entrance channel 14A, to measure absolute pressure and communicate parametric value P1. In some of these embodiments, the sensor chip package 12, in addition to the position sensor, can include a downstream absolute pressure sensor, e.g. positioned in the downstream exit channel 14B, to measure absolute pressure and communicate parametric value P2. In some of the embodiments, the sensor chip package 12, in addition to the position sensor, can include both an upstream absolute pressure sensor and a downstream absolute pressure sensor to measure absolute pressure and communicate parametric values P1 and P2. In some embodiments, the sensor chip package 12 can include, in addition to the position sensor, a differential pressure sensor to measure differential pressure (DP). In some embodiments, the sensor chip package 12 can include, in addition to the position sensor, the differential pressure sensor and one or both of the upstream absolute pressure sensor and a downstream absolute pressure sensor to measure pressures and generate parametric values DP and P1 or P2, or both. In some embodiments, the sensor chip package 12 can include, in addition to the position sensor, a temperature sensor to measure temperature of the orifice and reservoir 14C. In some embodiment, the sensor chip package 12 can include, in addition to the position sensor, the temperature sensor. In some embodiments, the sensor chip package 12 can include, in addition to the position sensor, the temperature sensor and at least one selected from a group comprising the differential pressure sensor, upstream absolute pressure sensor and the downstream absolute pressure sensor. Obviously, the sensor chip package 12 included with the valve assembly may be dependent on the sensor configuration of the manufacturer's fluid processing system.

In each aforementioned embodiment, the position of the valve stem 10A and/or the disk 10B and the parametric values P0-P3 for the absolute pressures are communicated to the control unit 20 and read by the control unit 20 for controlling operation of the valve assembly. In some embodiments, the position of the valve stem 10A and/or the disk 10B, parametric values P0-P3 for absolute pressures, and at least one selected from the group comprising a parametric value for DP and temperature are communicated to the control unit 20 and read by the control unit 20 for controlling operation of the valve assembly. In addition, if P3 is updated, updated P3 is provided to the process tool 18 to be used to adjust operation of either the process chamber 18A or the wafer chuck 18B. In some embodiments, the valve assembly may be included in the process tool 18, e.g. in the gas manifold 18B or on top of the process chamber 18A.

Figure 2:
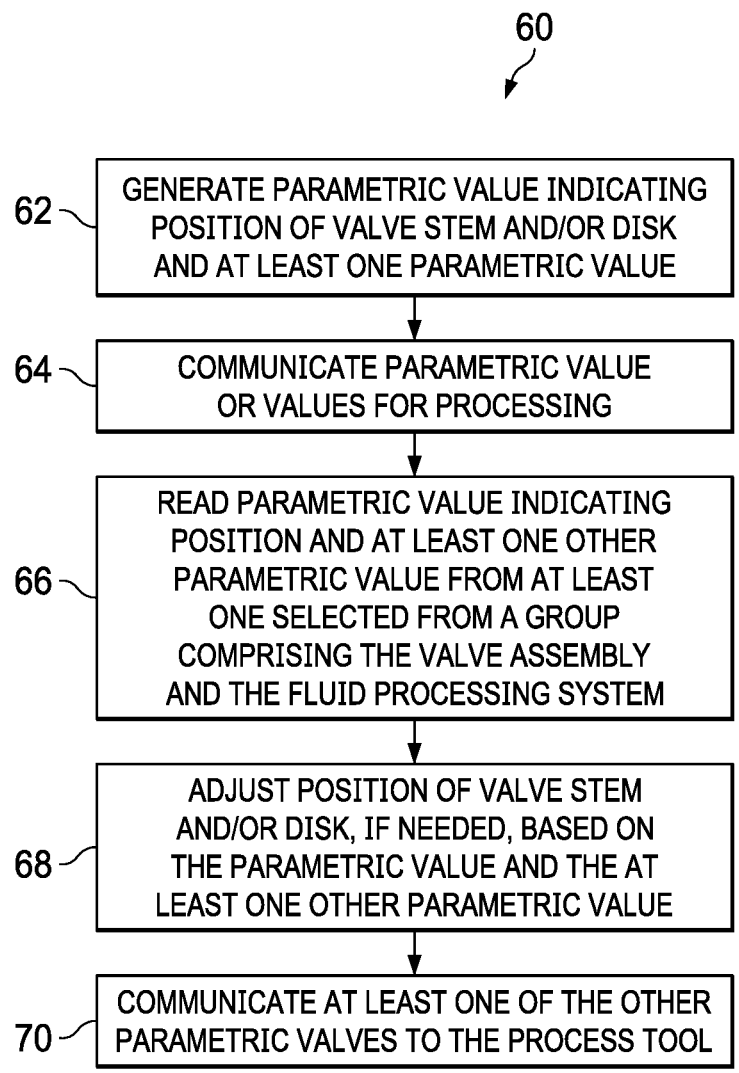
FIG. 2 is an illustration of a flow diagram of an algorithm used to generate parametric values, communicate the parametric values, and control flow rate of the valve assembly based on the parametric values, in accordance with certain example embodiments.

Referring not to FIG. 2, illustrated is a flow diagram of an algorithm used to generate parametric values, communicate the parametric values, and control flow rate of the valve assembly based on the parametric values, according to certain example embodiments, denoted generally as 60. The algorithm 60 begins at block 62 at the valve assembly where the algorithm generates at least one parametric value. The parametric value generated indicates position of the valve stem 10A or Disk 10B, or both. In addition to the parametric value indicating the position of the valve stem 10A or disk 10B, the algorithm can generate at least one other parametric value indicating absolute pressure from at least one selected from a group comprising an upstream absolute pressure sensor and at least one downstream absolute pressure sensor. Other parametric values generated can include DP and temperature.

In an embodiment, the fluid processing system can include the upstream absolute pressure sensor or sensors positioned at an upstream location or locations from the valve assembly. The downstream absolute pressure sensor or sensors can be positioned at a downstream location from the valve assembly. In essence, the absolute pressure sensors measure pressure and the algorithm 60 generates P0 and P3. In some embodiments, depending on a manufacturer's facilities, sensor 30 or sensor 32, or both, are used to measure pressure and the algorithm 60 generates P1 and P2 in addition to P0 and P3.

In an embodiment, the sensor chip package 12 can include the at least one selected from a group comprising an upstream absolute pressure sensor positioned in the upstream entrance channel 14A of the valve block 14 and a downstream absolute pressure sensor positioned in the downstream exit channel 14B of the valve block 14. In addition, the sensor chip package 12 of the valve 10 can include a differential pressure sensor to measure differential pressure. Furthermore, the sensor chip package 12 of the valve 10 can include a temperature sensor to measure temperature. More specifically, the sensor chip package 12 having a particular sensor configuration can be coupled with a valve 10 based on a particular sensor configuration of the fluid processing system.

The algorithm 60, at minimum, generates the parametric values indicating position of the valve stem 10A or Disk 10B, parametric values P0 and P3 indicating absolute pressures at the fluid source 16 and the process tool 18, and at least one selected from a group comprising parametric values P1 and P2 indicating upstream and downstream absolute pressures in the valve assembly or at locations outside of the valve assembly. In some embodiments, a parametric value indicating differential pressure (DP) is generated. In some embodiments, a parametric value indicating temperature is generated. In some embodiments, parametric values for DP and temperature are generated.

At block 64, the algorithm 60 communicates the generated parametric values from the sensor chip package 12 and other sensors from the fluid processing system for further processing. At block 66, the communicated parametric values, including valve stem 10A or Disk 10B position, absolute pressures, and, optionally, differential pressures, and temperature are read and processed and along with stored a-priori information used to determine a desired flow rate. The desired flow rate can be based on a set point value, fluid type, position of valve stem 10A and/or the disk 10B, current flow rate, temperature, and pressure (absolute and differential). At block 68, the position of the valve stem 10A and disk 10B is adjusted using the determined flow rate and correlated stored variables describing various positions of the valve stem 10A and disk 10B. At block 70, at least one of the parametric values, such as any adjustment to P3, is communicated to the process tool 18.

Figure 3:
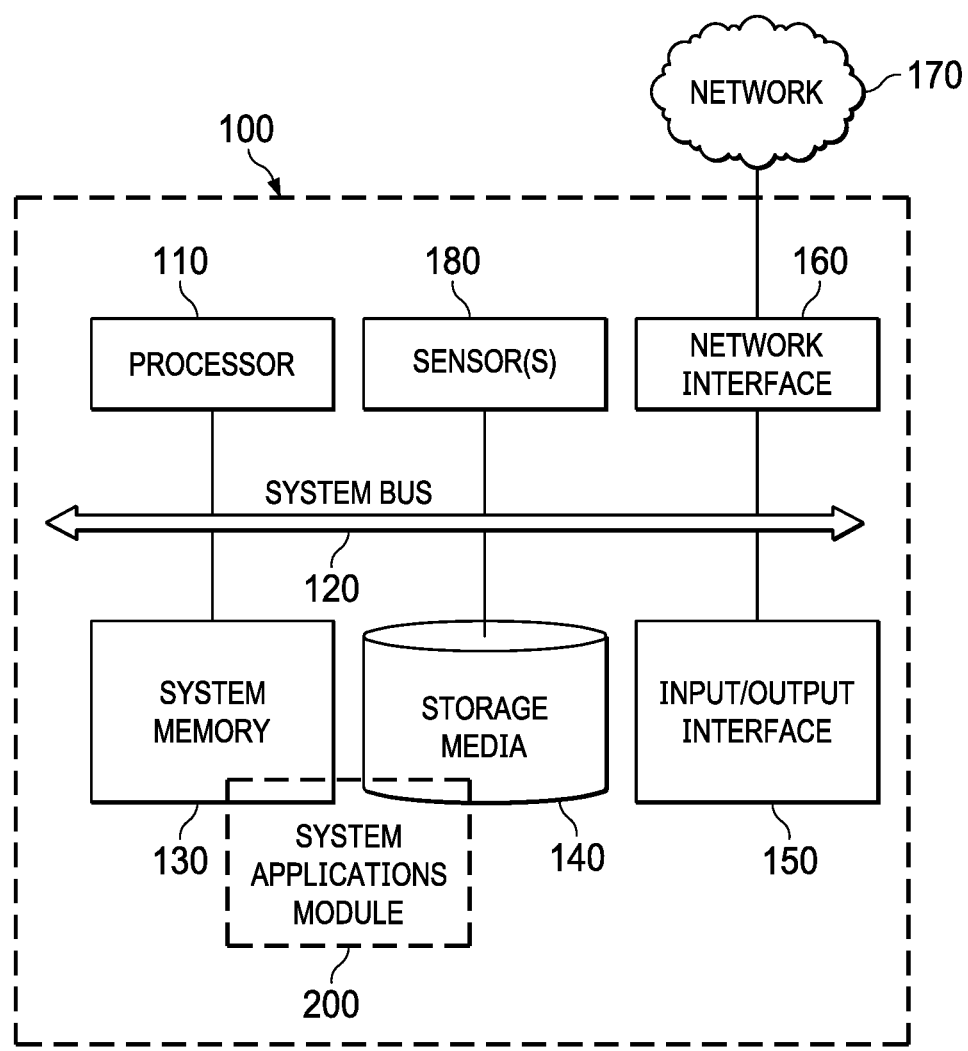
FIG. 3 is an illustration of a computing machine and a system applications module, in accordance with certain example embodiments.

Referring now to FIG. 3, illustrated is a computing machine 100 and a system applications module 200, in accordance with example embodiments. The computing machine 100 can correspond to any of the various computers, mobile devices, laptop computers, Internet of Things (IoT), servers, embedded systems, or computing systems presented herein. The module 200 can comprise one or more hardware or software elements, e.g. other OS application and user and kernel space applications, designed to facilitate the computing machine 100 in performing the various methods and processing functions presented herein. The computing machine 100 can include various internal or attached components such as a processor 110, system bus 120, system memory 130, storage media 140, input/output interface 150, a network interface 160 for communicating with a network 170, e.g. cellular/GPS, Bluetooth, WIFI, or Devicenet, EtherCAT, Analog, RS485, etc., and one or more sensors 180.

The computing machines can be implemented as a conventional computer system, an embedded controller, a laptop, a server, a mobile device, a smartphone, a wearable computer, a customized machine, any other hardware platform, or any combination or multiplicity thereof. The computing machines can be a distributed system configured to function using multiple computing machines interconnected via a data network or bus system.

The processor 110 can be designed to execute code instructions in order to perform the operations and functionality described herein, manage request flow and address mappings, and to perform calculations and generate commands. The processor 110 can be configured to monitor and control the operation of the components in the computing machines. The processor 110 can be a general purpose processor, a processor core, a multiprocessor, a reconfigurable processor, a microcontroller, a digital signal processor ("DSP"), an application specific integrated circuit ("ASIC"), a controller, a state machine, gated logic, discrete hardware components, any other processing unit, or any combination or multiplicity thereof. The processor 110 can be a single processing unit, multiple processing units, a single processing core, multiple processing cores, special purpose processing cores, co-processors, or any combination thereof. According to certain embodiments, the processor 110 along with other components of the computing machine 100 can be a software based or hardware based virtualized computing machine executing within one or more other computing machines.

The system memory 130 can include non-volatile memories such as read-only memory ("ROM"), programmable read-only memory ("PROM"), erasable programmable read-only memory ("EPROM"), flash memory, or any other device capable of storing program instructions or data with or without applied power. The system memory 130 can also include volatile memories such as random access memory ("RAM"), static random access memory ("SRAM"), dynamic random access memory ("DRAM"), and synchronous dynamic random access memory ("SDRAM"). Other types of RAM also can be used to implement the system memory 130. The system memory 130 can be implemented using a single memory module or multiple memory modules. While the system memory 130 is depicted as being part of the computing machine, one skilled in the art will recognize that the system memory 130 can be separate from the computing machine 100 without departing from the scope of the subject technology. It should also be appreciated that the system memory 130 can include, or operate in conjunction with, a non-volatile storage device such as the storage media 140.

The storage media 140 can include a hard disk, a floppy disk, a compact disc read-only memory ("CD-ROM"), a digital versatile disc ("DVD"), a Blu-ray disc, a magnetic tape, a flash memory, other non-volatile memory device, a solid state drive ("SSD"), any magnetic storage device, any optical storage device, any electrical storage device, any semiconductor storage device, any physical-based storage device, any other data storage device, or any combination or multiplicity thereof. The storage media 140 can store one or more operating systems, application programs and program modules, data, or any other information. The storage media 140 can be part of, or connected to, the computing machine. The storage media 140 can also be part of one or more other computing machines that are in communication with the computing machine such as servers, database servers, cloud storage, network attached storage, and so forth.

The applications module 200 and other OS application modules can comprise one or more hardware or software elements configured to facilitate the computing machine with performing the various methods and processing functions presented herein. The applications module 200 and other OS application modules can include one or more algorithms or sequences of instructions stored as software or firmware in association with the system memory 130, the storage media 140 or both. The storage media 140 can therefore represent examples of machine or computer readable media on which instructions or code can be stored for execution by the processor 110. Machine or computer readable media can generally refer to any medium or media used to provide instructions to the processor 110. Such machine or computer readable media associated with the applications module 200 and other OS application modules can comprise a computer software product. It should be appreciated that a computer software product comprising the applications module 200 and other OS application modules can also be associated with one or more processes or methods for delivering the applications module 200 and other OS application modules to the computing machine via a network, any signal-bearing medium, or any other communication or delivery technology. The applications module 200 and other OS application modules can also comprise hardware circuits or information for configuring hardware circuits such as microcode or configuration information for an FPGA or other PLD. In one exemplary embodiment, applications module 200 and other OS application modules can include algorithms capable of performing the functional operations described by the flow charts (modes of operation) computer systems presented herein.

The input/output ("I/O") interface 150 can be configured to couple to one or more external devices, to receive data from the one or more external devices, and to send data to the one or more external devices. Such external devices along with the various internal devices can also be known as peripheral devices. The I/O interface 150 can include both electrical and physical connections for coupling the various peripheral devices to the computing machine or the processor 110. The I/O interface 150 can be configured to communicate data, addresses, and control signals between the peripheral devices, the computing machine, or the processor 110. The I/O interface 150 can be configured to implement any standard interface, such as small computer system interface ("SCSI"), serial-attached SCSI ("SAS"), fiber channel, peripheral component interconnect ("PCI"), PCI express (PCIe), serial bus, parallel bus, advanced technology attached ("ATA"), serial ATA ("SATA"), universal serial bus ("USB"), Thunderbolt, FireWire, various video buses, and the like. The I/O interface 150 can be configured to implement only one interface or bus technology. Alternatively, the I/O interface 150 can be configured to implement multiple interfaces or bus technologies. The I/O interface 150 can be configured as part of, all of, or to operate in conjunction with, the system bus 120. The I/O interface 150 can include one or more buffers for buffering transmissions between one or more external devices, internal devices, the computing machine, or the processor 120.

The I/O interface 120 can couple the computing machine to various input devices including mice, touch-screens, scanners, electronic digitizers, sensors, receivers, touchpads, trackballs, cameras, microphones, keyboards, any other pointing devices, or any combinations thereof. The I/O interface 120 can couple the computing machine to various output devices including video displays, speakers, printers, projectors, tactile feedback devices, automation control, robotic components, actuators, motors, fans, solenoids, valves, pumps, transmitters, signal emitters, lights, and so forth.

The computing machine 100 can operate in a networked environment using logical connections through the NIC 160 to one or more other systems or computing machines across a network. The network can include wide area networks (WAN), local area networks (LAN), intranets, the Internet, wireless access networks, wired networks, mobile networks, telephone networks, optical networks, or combinations thereof. The network can be packet switched, circuit switched, of any topology, and can use any communication protocol. Communication links within the network can involve various digital or an analog communication media such as fiber optic cables, free-space optics, waveguides, electrical conductors, wireless links, antennas, radio-frequency communications, and so forth.

The one or more sensors 180 can be a position sensor and pressure sensors. The pressure sensor can be an Absolute Pressure (P) sensor or a Differential Pressure (DP) sensor. The position sensor can be a capacitive, optical, strain gauge, or magnetic sensor. The sensors 180 can be traditional sensors or semiconductor based sensors.

The processor 110 can be connected to the other elements of the computing machine or the various peripherals discussed herein through the system bus 120. It should be appreciated that the system bus 120 can be within the processor 110, outside the processor 110, or both. According to some embodiments, any of the processors 110, the other elements of the computing machine, or the various peripherals discussed herein can be integrated into a single device such as a system on chip ("SOC"), system on package ("SOP"), or ASIC device.

Embodiments may comprise a computer program that embodies the functions described and illustrated herein, wherein the computer program is implemented in a computer system that comprises instructions stored in a machine-readable medium and a processor that executes the instructions. However, it should be apparent that there could be many different ways of implementing embodiments in computer programming, and the embodiments should not be construed as limited to any one set of computer program instructions unless otherwise disclosed for an exemplary embodiment. Further, a skilled programmer would be able to write such a computer program to implement an embodiment of the disclosed embodiments based on the appended flow charts, algorithms and associated description in the application text. Therefore, disclosure of a particular set of program code instructions is not considered necessary for an adequate understanding of how to make and use embodiments. Further, those skilled in the art will appreciate that one or more aspects of embodiments described herein may be performed by hardware, software, or a combination thereof, as may be embodied in one or more computing systems. Moreover, any reference to an act being performed by a computer should not be construed as being performed by a single computer as more than one computer may perform the act.

The example embodiments described herein can be used with computer hardware and software that perform the methods and processing functions described previously. The systems, methods, and procedures described herein can be embodied in a programmable computer, computer-executable software, or digital circuitry. The software can be stored on computer-readable media. For example, computer-readable media can include a floppy disk, RAM, ROM, hard disk, removable media, flash memory, memory stick, optical media, magneto-optical media, CD-ROM, etc. Digital circuitry can include integrated circuits, gate arrays, building block logic, field programmable gate arrays (FPGA), etc.

The example systems, methods, and acts described in the embodiments presented previously are illustrative, and, in alternative embodiments, certain acts can be performed in a different order, in parallel with one another, omitted entirely, and/or combined between different example embodiments, and/or certain additional acts can be performed, without departing from the scope and spirit of various embodiments. Accordingly, such alternative embodiments are included in the description herein.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

The above-disclosed embodiments have been presented for purposes of illustration and to enable one of ordinary skill in the art to practice the disclosure, but the disclosure is not intended to be exhaustive or limited to the forms disclosed. Many insubstantial modifications and variations will be apparent to those of ordinary skill in the art without departing from the scope and spirit of the disclosure. The scope of the claims is intended to broadly cover the disclosed embodiments and any such modification. Further, the following clauses represent additional embodiments of the disclosure and should be considered within the scope of the disclosure:

Clause 1, a valve assembly for controlling fluid flow rate, the valve assembly comprising: a valve block having an upstream reservoir, a downstream reservoir and a valve seat for communicating fluid from an upstream location to a downstream location; a stand-alone valve having a moveable member; a sensor chip package having at least one sensor coupled with the stand-alone valve; and a controller interface for sending at least one measured parametric value provided by the at least one sensor and for receiving a control signal used to adjust valve stroke of the stand-alone valve, the control signal determined based on the at least one measured parametric value;

Clause 2, the valve assembly of clause 1, wherein the control signal of the stand-alone valve is determined based on the at least one measured parametric value and at least one other parametric value;

Clause 3, the valve assembly of clause 1, further comprising: a control unit having an interface for communicating with the controller interface of the stand-alone valve; and the control unit having another interface for receiving at least one other parametric value; the at least one other parametric value indicating pressure for at least one selected from a group comprising at least one upstream pressure sensor positioned at an upstream location from the stand-alone valve and at least one downstream pressure sensor positioned at a downstream location of the stand-alone valve; wherein the control unit generates the control signal to cause an adjustment to valve stroke based on the at least one parametric value and the at least one other parametric value;

Clause 4, the valve assembly of clause 1, wherein the sensor chip package comprises a position sensor;

Clause 5, the valve assembly of clause 4, wherein the sensor chip package generates the at least one parametric value indicating at least one selected from a group comprising a position of the moveable member and obstruction of a non-moveable member;

Clause 6, the valve assembly of clause 4, wherein the sensor chip package further comprises: at least one selected from a group comprising an upstream pressure sensor positioned in an upstream reservoir or upstream channel of the valve block, a downstream pressure sensor positioned in a downstream reservoir or downstream channel of the valve block, a differential pressure sensor positioned in the upstream reservoir and the downstream reservoir, and a temperature sensor positioned in at least one selected from a group comprising the upstream reservoir, the upstream channel, the downstream reservoir, the downstream channel, and a valve seat;

Clause 7, the valve assembly of clause 6, wherein the sensor chip package generates the at least one parametric value indicating: position of at least one selected from a group comprising a position of the moveable member and obstruction of a non-moveable member; and pressure of at least one selected from a group comprising the upstream pressure sensor, the downstream pressure sensor, and the differential pressure sensor;

Clause 8, the valve assembly of clause 6, wherein the sensor chip package generates the at least one parametric value indicating: position of at least one selected from a group comprising a position of the moveable member and obstruction of a non-moveable member; pressure of at least one selected from a group comprising the upstream pressure sensor, the downstream pressure sensor, and the differential pressure sensor; and temperature of at least one selected from a group comprising the upstream reservoir, the valve seat, and the downstream reservoir;

Clause 9, a fluid processing system for use in a manufacturing facility, the fluid processing system comprising: a valve block having an upstream reservoir, a downstream reservoir and a valve seat for communicating fluid from an upstream location to a downstream location; a stand-alone valve having a moveable member; a sensor chip package having at least one sensor coupled with the valve; an upstream fluid source fluidly coupled to the stand-alone valve; a downstream process tool fluidly coupled to the stand-alone valve; and a control unit having an interface communicable coupled to the stand-alone valve and the sensor chip package; wherein the control unit generates a control signal used to control stroke of the stand-alone valve based on at least one parametric value from the sensor chip package;

Clause 10, the fluid processing system of claim 9, wherein the interface is communicable coupled with at least one selected from a group comprising at least one upstream pressure sensor positioned at an upstream location and at least one downstream pressure sensor positioned at a downstream location; and interface generates the control signal used to control stroke of the stand-alone valve based on the at least one parametric value from the sensor chip package and at least one other parametric value from the group comprising the at least one upstream pressure sensor positioned at an upstream location from the valve block and the at least one downstream pressure sensor positioned at a downstream location from the valve block;

Clause 11, the fluid processing system of clause 9, wherein the sensor chip package comprises a position sensor;

Clause 12, the fluid processing system of clause 11, wherein the sensor chip package generates the at least one parametric value indicating at least one selected from a group comprising a position of the moveable member and obstruction of a non-moveable member;

Clause 13, the fluid processing system of clause 12, wherein the sensor chip package further comprises: at least one selected from a group comprising an upstream pressure sensor positioned in an upstream reservoir of the valve block, a downstream pressure sensor positioned in a downstream reservoir of the valve block, a differential pressure sensor positioned in the upstream reservoir and the downstream reservoir, and a temperature sensor positioned in at least one selected from a group comprising the upstream reservoir, the upstream channel, the downstream reservoir, the downstream channel, and a valve seat;

Clause 14, the fluid processing system of clause 13, wherein the sensor chip package generates the at least one parametric value indicating: position of at least one selected from a group comprising a position of the moveable member and obstruction of a non-moveable member; and pressure of at least one selected from a group comprising the upstream pressure sensor, the downstream pressure sensor, and the differential pressure sensor;

Clause 15, the fluid processing system of clause 13, wherein the sensor chip package generates the at least one parametric value indicating: position of at least one selected from a group comprising a position of the moveable member and obstruction of a non-moveable member; pressure of at least one selected from a group comprising the upstream pressure sensor, the downstream pressure sensor, and the differential pressure sensor; and temperature of at least one selected from a group comprising the upstream reservoir, the valve seat, and the downstream reservoir;

Clause 16, the fluid processing system of clause 9, the upstream fluid source comprises the at least one upstream pressure sensor;

Clause 17, the fluid processing system of clause 9, wherein the downstream process tool comprises a downstream pressure sensor;

Clause 18, a method of using a valve assembly for controlling fluid flow rate in a fluid processing system, the method comprising: generating, at the valve assembly a first parametric value indicating position of a moveable member of a stand-alone valve; generating, upstream of the valve assembly, a second parametric value indicating absolute pressure; generating, downstream of the valve assembly and at a process tool, a third parametric value indicating pressure; and adjusting a position of a valve based on the first parametric value, the second parametric value, the third parametric value, and at least one other parametric value selected from a group comprising set point value, current fluid flow rate, fluid type, at least one other pressure, temperature, and differential pressure;

Clause 19, the method of clause 18, further comprising: generating, from an upstream location between a fluid source and the valve assembly, another parametric value indicating pressure; and generating, from an upstream location between the process tool and the valve assembly, another parametric value indicating pressure; and Clause 20, the method of clause 18, further comprising: generating, at an upstream entrance channel of the valve assembly, another parametric value indicating pressure; and generating, at a downstream exit channel of the valve assembly, another parametric value indicting pressure.

What is claimed is:

1. A valve assembly for controlling fluid flow rate, the valve assembly comprising:
   a valve block having an upstream reservoir, a downstream reservoir and a valve seat for communicating fluid from an upstream location to a downstream location;
   a stand-alone valve having a moveable member;
   a sensor chip package having at least one on-board sensor coupled with the stand-alone valve; and
   a controller interface for receiving an at least one measured parametric value provided by the at least one on-board sensor, and for further receiving at least one other parametric value provided by at least one off-board sensor, the at least one off-board sensor located external to the valve assembly at a process tool;
   wherein the controller interface generates a control signal for the stand-alone valve, the control signal determined in response to the at least one measured parametric value and the at least one other measured parametric value;
   wherein a first parametric value indicating pressure is generated at an upstream entrance channel of the valve assembly; and
   wherein a second parametric value indicating pressure is generated at a downstream entrance channel of the valve assembly.

2. A fluid processing system for use in a manufacturing facility, the fluid processing system comprising:
   a valve block having an upstream reservoir, a downstream reservoir and a valve seat for communicating fluid from an upstream location to a downstream location;
   a stand-alone valve having a moveable member;
   a sensor chip package having at least one sensor coupled with the valve;
   an upstream fluid source fluidly coupled to the stand-alone valve, wherein a first pressure sensor is located between the valve block and the upstream fluid source;
   a downstream process tool fluidly coupled to the stand-alone valve, wherein a second pressure sensor is located between the valve block and the downstream process tool;
   wherein the downstream process tool comprises a downstream pressure sensor; and
   a control unit having an interface communicable coupled to the first pressure sensor, the second pressure sensor, the stand-alone valve and the sensor chip package;
   wherein the control unit generates a control signal used to control a stroke of the stand-alone valve based on at least one parametric value from the sensor chip package, the first pressure sensor, and the second pressure sensor.

3. A method of using a valve assembly for controlling fluid flow rate in a fluid processing system, the method comprising:
   generating, at the valve assembly a first parametric value indicating position of a moveable member of a stand-alone valve;
   generating, upstream of the valve assembly, a second parametric value indicating absolute pressure at a location between the valve assembly and an upstream fluid source;
   generating, at an upstream entrance channel of the valve assembly, another parametric valve indicating pressure;
   generating, downstream of the valve assembly and at a process tool, a third parametric value indicating pressure at a location between the valve assembly and a downstream process tool;
   generating, at a downstream exit channel of the valve assembly, another parametric value indicating pressure; and
   adjusting a position of a valve based on the first parametric value, the second parametric value, the third parametric value, and at least one other parametric value selected from a group comprising set point value, current fluid flow rate, fluid type, at least one other pressure, temperature, and differential pressure.

* * * * *